(12) United States Patent
Liu et al.

(10) Patent No.: US 10,548,214 B2
(45) Date of Patent: Jan. 28, 2020

(54) MULTI-LAYER CIRCUIT BOARD CAPABLE OF BEING APPLIED WITH ELECTRICAL TESTING AND METHOD FOR MANUFACTURING THE SAME

(71) Applicant: KINSUS INTERCONNECT TECHNOLOGY CORP., Taoyuan (TW)

(72) Inventors: Chin-Kuan Liu, Taoyuan (TW); Chao-Lung Wang, Taoyuan (TW); Shuo-Hsun Chang, Taoyuan (TW); Yu-Te Lu, Taoyuan (TW); Chin-Hsi Chang, Taoyuan (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 15/826,694

(22) Filed: Nov. 30, 2017

(65) Prior Publication Data

US 2019/0059154 A1 Feb. 21, 2019

(30) Foreign Application Priority Data

Aug. 18, 2017 (TW) .............................. 106128029 A

(51) Int. Cl.
*H05K 1/02* (2006.01)
*H05K 1/09* (2006.01)
*H05K 3/46* (2006.01)
*H05K 3/06* (2006.01)

(52) U.S. Cl.
CPC ............ *H05K 1/0268* (2013.01); *H05K 1/09* (2013.01); *H05K 3/064* (2013.01); *H05K 3/467* (2013.01); *H05K 3/4644* (2013.01); *H05K 3/4661* (2013.01); *H05K 2201/0302* (2013.01);
(Continued)

(58) Field of Classification Search
None
See application file for complete search history.

(56) References Cited

U.S. PATENT DOCUMENTS 3,991,231 A * 11/1976 Trausch ................. H05K 3/062
430/314
4,372,809 A * 2/1983 Grewal .................. H05K 3/244
204/192.12
(Continued)

*Primary Examiner* — Timothy J Thompson
*Assistant Examiner* — Muhammed Azam
(74) *Attorney, Agent, or Firm* — Idea Intellectual Limited; Margaret A. Burke; Sam T. Yip

(57) ABSTRACT

A multi-layer circuit board capable of being applied with electrical testing includes a metallic delivery loading plate, a bottom-layer circuit structure, a conductive corrosion-barrier layer, and a multi-layer circuit structure. The bottom-layer circuit structure is overlapping on the delivery loading plate. The conductive corrosion-barrier layer is disposed on the bottom dielectric layer. The multi-layer circuit structure is overlapping on the bottom-layer circuit structure. The top-layer circuit of the multi-layer circuit structure is electrically connected to the conductive corrosion-barrier layer through the inner-layer circuit of the multi-layer circuit structure and the bottom-layer circuit of the bottom-layer circuit structure. The delivery loading plate and the bottom dielectric layer of the bottom-layer circuit structure expose the conductive corrosion-barrier layer.

20 Claims, 7 Drawing Sheets

(52) U.S. Cl.
CPC .............. *H05K 2203/072* (2013.01); *H05K 2203/0723* (2013.01)

(56) References Cited

U.S. PATENT DOCUMENTS

| | | | | |
|---|---|---|---|---|
| 5,302,492 | A * | 4/1994 | Ott | H05K 3/108 216/20 |
| 5,369,220 | A * | 11/1994 | Harada | H01L 23/142 174/257 |
| 5,436,412 | A * | 7/1995 | Ahmad | H01L 23/49816 174/257 |
| 5,485,038 | A * | 1/1996 | Licari | H01L 21/481 257/700 |
| 5,485,081 | A * | 1/1996 | Whitehead | G01R 31/2805 324/73.1 |
| 5,534,466 | A * | 7/1996 | Perfecto | H01L 21/4857 156/250 |
| 6,041,495 | A * | 3/2000 | Yoon | H01L 23/3107 257/E23.063 |
| 6,144,213 | A * | 11/2000 | Johnson | G01R 31/2886 324/754.03 |
| 6,210,592 | B1 * | 4/2001 | Hunt | C23C 16/40 216/16 |
| 6,500,011 | B1 * | 12/2002 | Fujita | G11B 5/48 174/262 |
| 8,030,576 | B2 | 10/2011 | Kamei | H05K 3/243 174/255 |
| 8,304,907 | B2 * | 11/2012 | Lin | H01L 21/768 257/691 |
| 10,334,719 | B2 * | 6/2019 | Liu | H05K 1/0268 |
| 2005/0061542 | A1 * | 3/2005 | Aonuma | H05K 3/243 174/255 |
| 2006/0209497 | A1 * | 9/2006 | Ooi | C23C 18/1651 361/600 |
| 2007/0145543 | A1 * | 6/2007 | Zeng | H01L 23/66 257/664 |
| 2009/0229868 | A1 * | 9/2009 | Tsukada | H05K 3/4661 174/258 |
| 2009/0255717 | A1 * | 10/2009 | Mizushima | H05K 3/44 174/255 |
| 2010/0065322 | A1 * | 3/2010 | Ogawa | H01L 21/563 174/262 |
| 2010/0080957 | A1 * | 4/2010 | Chinn | B05D 5/00 428/147 |
| 2010/0103634 | A1 * | 4/2010 | Funaya | H01L 23/5389 361/761 |
| 2010/0307792 | A1 * | 12/2010 | Allemand | B82Y 10/00 174/126.1 |
| 2011/0284269 | A1 * | 11/2011 | Maeda | H05K 1/113 174/251 |
| 2012/0222894 | A1 * | 9/2012 | Kaneko | H05K 3/244 174/257 |
| 2012/0312590 | A1 * | 12/2012 | Maeda | H05K 1/0269 174/261 |
| 2013/0169302 | A1 * | 7/2013 | Ricci | G01R 31/2887 324/750.25 |
| 2014/0021625 | A1 * | 1/2014 | Nakamura | H01L 23/145 257/773 |
| 2014/0224532 | A1 * | 8/2014 | Hashimoto | G01R 31/2886 174/258 |
| 2015/0282314 | A1 * | 10/2015 | Furuta | H05K 3/4007 174/257 |
| 2016/0219693 | A1 * | 7/2016 | Nishimoto | H01L 23/3735 |
| 2017/0023615 | A1 * | 1/2017 | Ekin | G01R 1/0491 |
| 2017/0082681 | A1 * | 3/2017 | Yang | G01R 31/2818 |
| 2019/0059153 | A1 * | 2/2019 | Liu | H05K 1/0268 |
| 2019/0059154 | A1 * | 2/2019 | Liu | H05K 1/0268 |

* cited by examiner (54)

MULTI-LAYER CIRCUIT BOARD CAPABLE OF BEING APPLIED WITH ELECTRICAL TESTING AND METHOD FOR MANUFACTURING THE SAME

CROSS-REFERENCE TO RELATED APPLICATION

This non-provisional application claims priority under 35 U.S.C. § 119(a) to Patent Application No. 106128029 filed in Taiwan, R.O.C. on Aug. 18, 2017, the entire contents of which are hereby incorporated by reference.

FIELD OF INVENTION

The instant disclosure relates to a multi-layer circuit board and method for manufacturing the same, in particular, to a multi-layer circuit board capable of being applied with electrical testing and method for manufacturing the multi-layer circuit board.

BACKGROUND

In electronics industries, circuit board manufacturers are responsible for the production of multi-layer circuit boards, while assembly companies are responsible for wire bonding and packaging the chips on the multi-layer circuit boards and for electrical properties tests of the electronic components after the chips and the circuit boards are packaged to be electronic components in the packaging procedures.

Before the chips and the conventional multi-layer circuit boards are delivering to the assembly company, electrical properties tests can be applied to the chips but cannot be applied to the conventional multi-layer circuit board. As a result, after the packaging procedures, the multi-layer circuit board, units on the multi-layer circuit board, and connections between the multi-layer circuit board and the units have to be checked and analyzed carefully to find problems when the electrical properties tests of the component are not qualified. Nevertheless, the sizes of such kinds of electronic components are quite tiny and the structures of the electronic components are fine. As a result, it takes time and labor to find out the reasons causing the unqualified electrical testing result. Furthermore, the responsibilities for the unqualified electrical testing result cannot be clarified.

SUMMARY OF THE INVENTION

In view of the problems mentioned above, a multi-layer circuit board capable of being applied with electrical testing and method for manufacturing the same are provided. The multi-layer circuit board can have electrical testing before the multi-layer circuit board is provided for the assembly company for packaging. Therefore, the cost for figuring out reasons of the unqualified electronic component can be reduced, and the responsibilities for the unqualified electrical testing result of the electronic component can be clarified efficiently.

In view of this, an embodiment of the instant disclosure provides a multi-layer circuit board capable of being applied with electrical testing, and the multi-layer circuit board comprises:

a delivery loading plate made of metal and comprising a first side and a second side opposite to the first side;

a bottom-layer circuit structure overlapping on the first side of the delivery loading plate and comprising:

a bottom dielectric layer on the first side of the delivery loading plate; and a bottom-layer circuit on the bottom dielectric layer;

a conductive corrosion-barrier layer on the bottom dielectric layer and electrically connected to the bottom-layer circuit; and a multi-layer circuit structure overlapping on the bottom-layer circuit structure and comprising:

a top-layer circuit electrically connected to the bottom-layer circuit;

a top dielectric layer between the top-layer circuit and the bottom-layer circuit structure;

an inner dielectric layer on the bottom dielectric layer and the bottom-layer circuit; and an inner-layer circuit on the inner dielectric layer and connected to the top dielectric layer; wherein the top-layer circuit is on the top dielectric layer, and the delivery loading plate and the bottom dielectric layer expose the conductive corrosion-barrier layer.

The multi-layer circuit structure is disposed on the delivery loading plate through the bottom-layer circuit structure. The delivery loading plate exposes the conductive corrosion-barrier layer. The top-layer circuit of the multi-layer circuit structure is electrically connected to the conductive corrosion-barrier layer through the inner-layer circuit and the bottom-layer circuit. Therefore, before the multi-layer circuit board is delivered to the assembly company or before the multi-layer circuit board is packaged with chips, an electrical testing can be applied to the multi-layer circuit board to check if the multi-layer circuit board can be operated normally or not. Hence, not only the product quality of multi-layer circuit board can be checked, but also the cost for figuring out reasons of the unqualified electronic component can be reduced. Moreover, the responsibilities for the unqualified electrical testing result of the electronic component can be clarified efficiently.

In one embodiment, the bottom-layer circuit is embedded on the bottom dielectric layer, the top-layer circuit is embedded on the top dielectric layer, and the inner-layer circuit is embedded on the inner dielectric layer.

In one embodiment, the multi-layer circuit structure further comprises a first conduction pillar. The first conduction pillar upwardly inserts on the top dielectric layer and the first conduction pillar is connected between the top-layer circuit and the inner-layer circuit. The bottom-layer circuit structure comprises a second conduction pillar. The second conduction pillar upwardly inserts on the inner dielectric layer and the second conduction pillar is connected between the inner-layer circuit and the bottom-layer circuit. The top-layer circuit is electrically connected to the bottom-layer circuit through the first conduction pillar, the inner-layer circuit, and the second conduction pillar.

In one embodiment, the conductive corrosion-barrier layer is embedded on the bottom dielectric layer.

In one embodiment, the conductive corrosion-barrier layer comprises at least one of gold, nickel, tin, iron, and titanium.

In one embodiment, the conductive corrosion-barrier layer comprises a gold layer and a nickel layer, and the nickel layer is connected between the gold layer and the bottom-layer circuit.

In one embodiment, the multi-layer circuit board further comprises a solder mask layer. The solder mask layer exposes the top-layer circuit to cover the top dielectric layer.

In view of this, an embodiment of the instant disclosure provides a manufacturing method for a multi-layer circuit board capable of being applied with electrical testing, and the manufacturing method comprises:

providing a first loading plate, wherein the first loading plate comprises a substrate, a conductive layer, and a metal interface layer, the conductive layer and the metal interface layer are sequentially overlapping on the substrate, a bottom surface of the metal interface layer is detachably connected to the conductive layer, and the metal interface layer is conductive;

forming a second loading plate overlapping on the metal interface layer by electroplating the first loading plate, wherein the second loading plate has a first surface and a second surface opposite to the first surface, the second surface is connected to a top surface of the metal interface layer;

forming a corrosion-blocking layer on the first surface of the second loading plate by electroplating the second loading plate, wherein the corrosion-blocking layer is conductive;

forming a multi-layer circuit structure on the corrosion-blocking layer, wherein the multi-layer circuit structure comprises a top-layer circuit, a top dielectric layer, an inner-layer circuit, and an inner dielectric layer, wherein the top-layer circuit, the top dielectric layer, the inner-layer circuit, and the inner dielectric layer are sequentially overlapping on the corrosion-blocking layer, and the top-layer circuit is electrically connected to the inner-layer circuit;

disposing a first electroplating seed layer on the inner dielectric layer;

forming a first patterned photoresist layer on the first electroplating seed layer;

forming a bottom-layer circuit on the inner dielectric layer by electroplating the first electroplating seed layer, wherein the bottom-layer circuit is electrically connected to the inner-layer circuit;

forming a second patterned photoresist layer on the bottom-layer circuit and the first patterned photoresist layer;

forming a conductive corrosion-barrier layer on the bottom-layer circuit;

removing the first patterned photoresist layer and the second patterned photoresist layer;

etching portion of the first electroplating seed layer uncovered by the bottom-layer circuit;

forming a bottom dielectric layer exposing the conductive corrosion-barrier layer on the bottom-layer circuit and the inner dielectric layer so as to obtain a bottom-layer circuit structure on the multi-layer circuit structure;

disposing a second electroplating seed layer on the bottom dielectric layer and the conductive corrosion-barrier layer;

forming a third patterned photoresist layer on the second electroplating seed layer;

forming a delivery loading plate on the bottom dielectric layer by electroplating the second electroplating seed layer;

forming a fourth patterned photoresist layer covering the delivery loading plate, and peeling off the substrate and the conductive layer of the first loading plate;

removing the second loading plate, the metal interface layer, the corrosion-blocking layer, the third patterned photoresist layer, and the fourth patterned photoresist layer; and etching portions of the second electroplating seed layer uncovered by the delivery loading plate to allow the delivery loading plate and the bottom dielectric layer to expose the conductive corrosion-barrier layer so as to obtain the multi-layer circuit board.

According to the multi-layer circuit board manufactured by the manufacturing method, the multi-layer circuit structure is disposed on the delivery loading plate through the bottom-layer circuit structure, the delivery loading plate exposes the conductive corrosion-barrier layer, and the top-layer circuit of the multi-layer circuit structure is electrically connected to the conductive corrosion-barrier layer through the bottom-layer circuit and the electrical connection layer. Therefore, before the multi-layer circuit board is delivered to the assembly company or before the multi-layer circuit board is packaged with chips, an electrical testing can be applied to the multi-layer circuit board to check if the multi-layer circuit board can be operated normally or not. Hence, not only the product quality of multi-layer circuit board can be checked, but also the cost for figuring out reasons of the unqualified electronic component can be reduced. Moreover, the responsibilities for the unqualified electrical testing result of the electronic component can be clarified efficiently.

In one embodiment, the step of forming the corrosion-blocking layer on the first surface of the second loading plate comprises: electroless plating the first surface in a nickel sulfate hexahydrate ($NiSO_4.6H_2O$) solution having a concentration from 260 g/l to 310 g/l to obtain the corrosion-blocking layer on the first surface.

In one embodiment, the step of forming a conductive corrosion-barrier layer on the bottom-layer circuit comprises: electroless plating the bottom-layer circuit in a nickel sulfate hexahydrate ($NiSO_4.6H_2O$) solution having a concentration from 260 g/l to 310 g/l to obtain a nickel layer on the bottom-layer circuit; and electroplating the nickel layer in a gold solution having a concentration from 2.8 g/l to 6.0 g/l under a voltage from 0.1 volts to 5 volts to obtain a gold layer on the nickel layer so as to obtain the conductive corrosion-barrier layer.

BRIEF DESCRIPTION OF THE DRAWINGS

The disclosure will become more fully understood from the detailed description given herein below for illustration only, and thus not limitative of the disclosure, wherein.

DETAILED DESCRIPTION OF THE INVENTION

Drawings and embodiments are provided below for elucidating the technical features of the instant disclosure.

Figure 1:
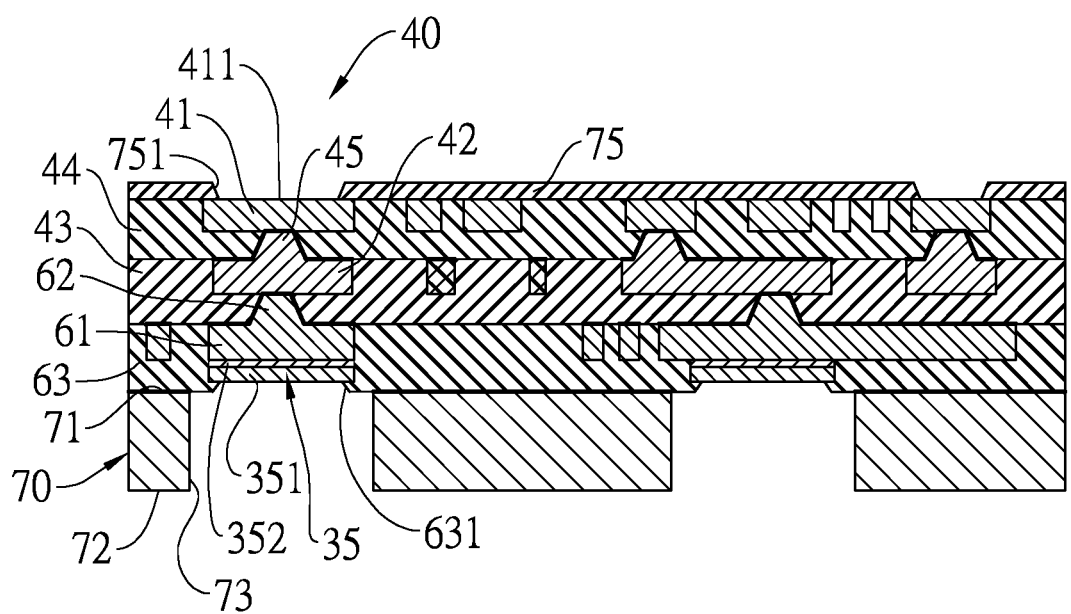
FIG. 1 illustrates a sectional view of a multi-layer circuit board capable of being applied with electrical testing, according to an exemplary embodiment of the instant disclosure.

Please refer to FIG. 1. An exemplary embodiment of the instant disclosure provides a multi-layer circuit board capable of being applied with electrical testing, and the multi-layer circuit board comprises a delivery loading plate 70, a bottom-layer circuit structure 60, a conductive corrosion-barrier layer 35, a multi-layer circuit structure 40, and a solder mask layer 75.

Please refer to FIG. 1. The delivery loading plate 70 comprises a first side 71 and a second side 72 opposite to the first side 71. The delivery loading plate 70 is made of metal. In one embodiment, the delivery loading plate 70 is made of copper, but embodiments are not limited thereto. In some embodiments, the delivery loading plate 70 may be made of nickel, aluminum, or iron.

Please refer to FIG. 1. The bottom-layer circuit structure 60 is overlapping on the first side 71 of the delivery loading plate 70. The bottom-layer circuit structure 60 comprises a bottom dielectric layer 63 and a bottom-layer circuit 61. The bottom dielectric layer 63 is overlapping on the first side 71 of the delivery loading plate 70, and the bottom-layer circuit 61 is embedded on the bottom dielectric layer 63.

In one embodiment, the bottom dielectric layer 63 is an Ajinomoto build-up film (ABF), but embodiments are not limited thereto. In some embodiments, the bottom dielectric layer 63 is a plastic sheet made of bismaleimide triazine (BT) and glass fiber.

Please refer to FIG. 1. The conductive corrosion-barrier layer 35 is embedded on the bottom dielectric layer 63 and electrically connected to the bottom-layer circuit 61. In one embodiment, the conductive corrosion-barrier layer 35 is made of gold and nickel, but embodiments are not limited thereto. Specifically, in one embodiment, the conductive corrosion-barrier layer 35 comprises a gold layer 351 and a nickel layer 352, and the nickel layer 352 is connected between the gold layer 351 and the bottom-layer circuit 61. In some embodiments, the conductive corrosion-barrier layer 35 is made of tin. In detail, as shown in FIG. 1, the delivery loading plate 70 is not in contact with the conductive corrosion-barrier layer 35.

Please refer to FIG. 1. The multi-layer circuit structure 40 is overlapping on the bottom-layer circuit structure 60. The multi-layer circuit structure 40 comprises a top-layer circuit 41 and a top dielectric layer 44. The top-layer circuit 41 is electrically connected to the bottom-layer circuit 61. The top dielectric layer 44 is between the top-layer circuit 41 and the bottom-layer circuit structure 60, and the top-layer circuit 41 is embedded on the top dielectric layer 44.

Please refer to FIG. 1. In one embodiment, the multi-layer circuit structure 40 comprises an inner dielectric layer 43, an inner-layer circuit 42. The inner dielectric layer 43 is overlapping on the bottom dielectric layer 63 and the bottom-layer circuit 61. The inner-layer circuit 42 is embedded on the inner dielectric layer 43 and connected to the top dielectric layer 44. The top-layer circuit 41 is electrically connected to the bottom-layer circuit 61 through the inner-layer circuit 42. Specifically, in one embodiment, the multi-layer circuit structure 40 further comprises a first conduction pillar 45. The first conduction pillar 45 upwardly inserts on the top dielectric layer 44 and the first conduction pillar 45 is connected between the top-layer circuit 41 and the inner-layer circuit 42. The bottom-layer circuit structure 60 comprises a second conduction pillar 62. The second conduction pillar 62 upwardly inserts on the inner dielectric layer 44 and the second conduction pillar 62 is connected between the inner-layer circuit 42 and the bottom-layer circuit 61. Accordingly, the top-layer circuit 41 is electrically connected to the bottom-layer circuit 61 through the first conduction pillar 45, the inner-layer circuit 42, and the second conduction pillar 62. In one embodiment, as shown in FIG. 1, a bottom portion of at least one portion of the inner-layer circuit 42 is connected to a top portion of the bottom-layer circuit 61 via the first conduction pillar 45, and a top portion of the at least one portion of the inner-layer circuit 42 is connected to a bottom portion of the top-layer circuit 41 via the second conduction pillar 62.

In one embodiment, both or one of the top dielectric layer 44 and the inner dielectric layer 43 is an Ajinomoto build-up film, but embodiments are not limited thereto. In some embodiments, both or one of the top dielectric layer 44 and the inner dielectric layer 43 is a plastic sheet made of bismaleimide triazine and glass fiber.

Please refer to FIG. 1. The solder mask layer 75 exposes the top-layer circuit 41 and covers the top dielectric layer 44. Specifically, in one embodiment, the solder mask layer 75 has a through hole 751, and the through hole 751 is connected to the top-layer circuit 41, so that the solder mask layer 75 exposes the top-layer circuit 41. More specifically, in one embodiment, the top-layer circuit 41 comprises a predefined connection area 411, and the through hole 751 is connected to the predefined connection area 411 of the top-layer circuit 41, so that the solder mask layer 75 exposes the predefined connection area 411 of the top-layer circuit 41.

Please refer to FIG. 1. The delivery loading plate 70 and the bottom dielectric layer 63 expose the conductive corrosion-barrier layer 35. Specifically, in one embodiment, the delivery loading plate 70 has a via 73 defined through the delivery loading plate 70 from the first side 71 to the second side 72. The bottom dielectric layer 63 has an opening 631 connected to the via 73, and the opening 631 is connected to the conductive corrosion-barrier layer 35. Accordingly, the delivery loading plate 70 and the bottom dielectric layer 63 expose the conductive corrosion-barrier layer 35.

Figure 2:
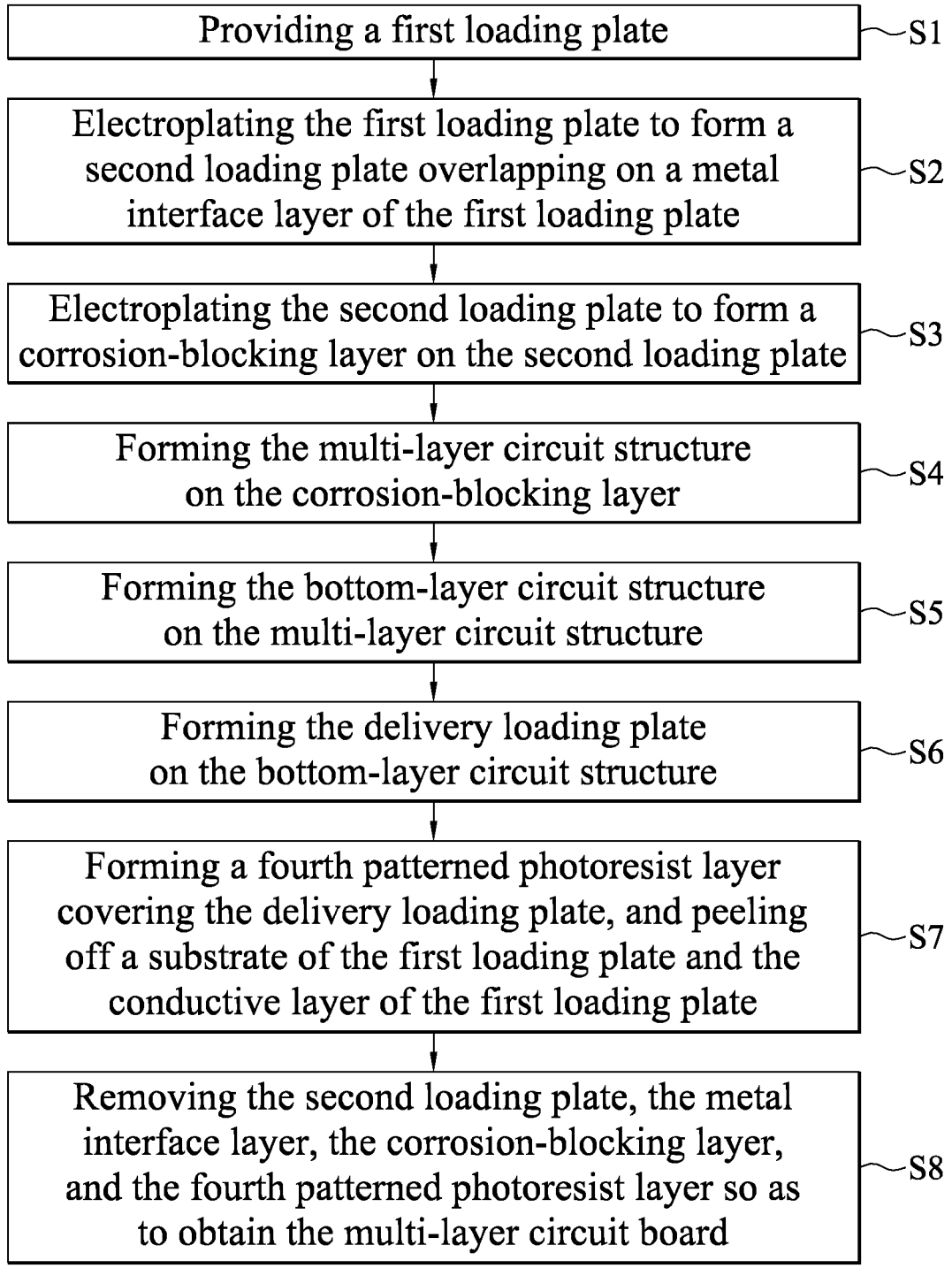
FIG. 2 illustrates a flowchart of a manufacturing method of the multi-layer circuit board of the exemplary embodiment.

Please refer to FIG. 2. The manufacturing method for the multi-layer circuit board comprises: providing a first loading plate 10 (step S1), electroplating the first loading plate 10 to form a second loading plate 20 overlapping on a metal interface layer 13 of the first loading plate 10 (step S2), electroplating the second loading plate 20 to form a corrosion-blocking layer 30 on the second loading plate 20 (step S3), forming the multi-layer circuit structure 40 on the corrosion-blocking layer 30 (step S4), forming the bottom-layer circuit structure 60 on the multi-layer circuit structure 40 (step S5), forming the delivery loading plate 70 on the bottom-layer circuit structure 60 (step S6), forming a fourth patterned photoresist layer 50c covering the delivery loading plate 70, and peeling off a substrate 11 of the first loading plate 10 and the conductive layer 12 of the first loading plate 10 (step S7), removing the second loading plate 20, the metal interface layer 13, the corrosion-blocking layer 30, and the fourth patterned photoresist layer 50c so as to obtain the multi-layer circuit board (step S8).

Figure 3A:
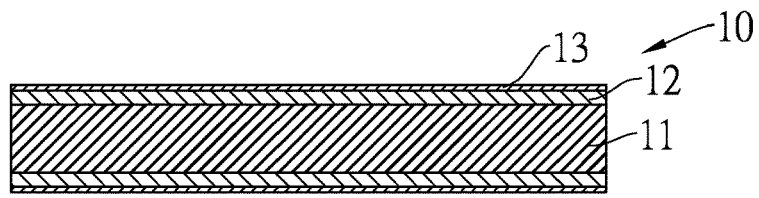
FIGS. 3A to 3N, FIG. 4A, and FIG. 4B illustrate schematic views showing the steps of the manufacturing method of the multi-layer circuit board of the exemplary embodiment.

Please refer to FIG. 3A. In the step of providing a first loading plate 10 (step S1), the first loading plate 10 comprises a substrate 11, a conductive layer 12, and a metal interface layer 13. The conductive layer 12 is on a surface of the substrate 11. The metal interface layer 13 is detachably on a surface of the conductive layer 12 distant from the substrate 11. In other words, the conductive layer 12 is between the substrate 11 and the metal interface layer 13. That is, the conductive layer 12 and the metal interface layer 13 are sequentially overlapping on the substrate 11, and a bottom surface of the metal interface layer 13 is detachably connected to the conductive layer 12. Wherein, the metal interface layer 13 is conductive. In one embodiment, the metal interface layer 13 is made of copper, but embodiments are not limited thereto.

Figure 3B:
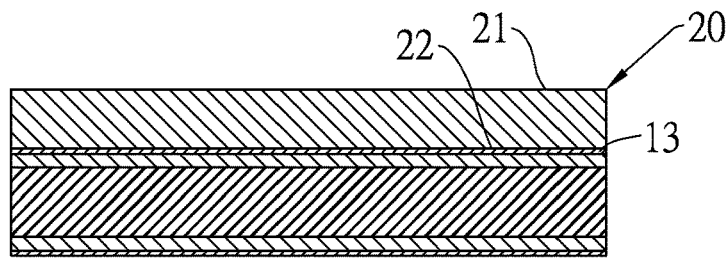

Please refer to FIG. 3B. In the step of electroplating the first loading plate 10 to form a second loading plate 20 overlapping on a top surface of the metal interface layer 13 (step S2), the second loading plate 20 has the first surface 21 and the second surface 22 opposite to the first surface 21, and the second side 22 is connected to the top surface of the metal interface layer 13.

In one embodiment, in the step of electroplating the first loading plate 10 to form a second loading plate 20 overlapping on a top surface of the metal interface layer 13 (step S2), the first loading plate 10 is electroplated in a copper sulfate (CuSO$_4$) solution having a concentration from 100 g/l to 120 g/l under a voltage from 5 volts to 6 volts for 108 minutes to obtain the second loading plate 20. In other words, the second loading plate 20 is made of copper, but embodiments are not limited thereto. In some embodiments, the second loading plate 20 may be made of nickel, aluminum, or iron.

Figure 3C:
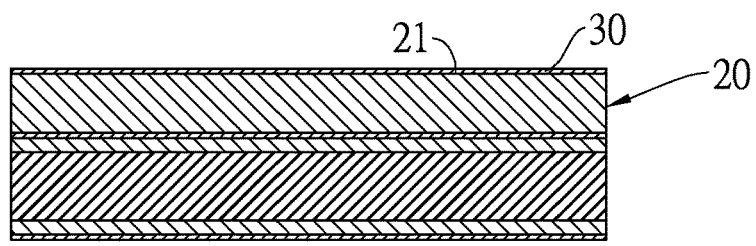

Please refer to FIG. 3C. In the step of electroplating the second loading plate 20 to form a corrosion-blocking layer 30 on the second loading plate 20 (step S3), the corrosion-blocking layer 30 is conductive and the corrosion blocking layer 30 covers the first surface 21 of the second loading plate 20.

In one embodiment, in the step of electroplating the second loading plate 20 to form a corrosion-blocking layer 30 on the second loading plate 20 (step S3), the first surface 21 of the second loading plate 20 is electroless-plated in a nickel sulfate hexahydrate (NiSO$_4$.6H$_2$O) solution having a concentration from 260 g/l to 310 g/l to obtain the corrosion-blocking layer 30 on the first surface 21 of the second loading plate 20. In other words, the corrosion-blocking layer 30 is made of nickel.

Figure 3D:
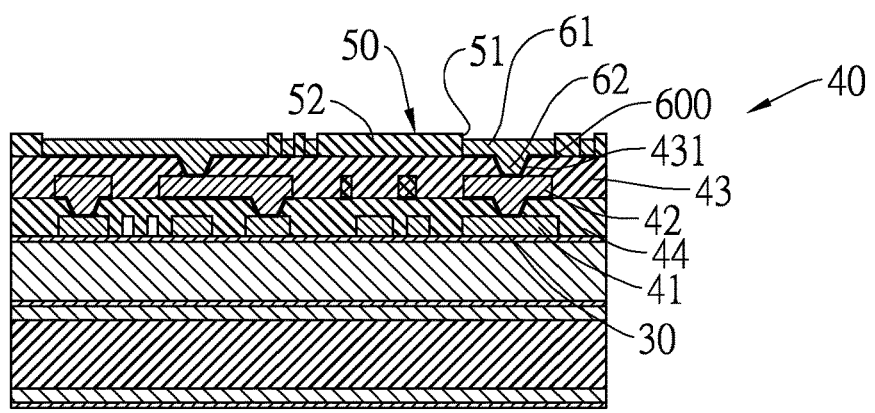

Please refer to FIG. 3D. In the step of forming the multi-layer circuit structure 40 on the corrosion-blocking layer 30 (step S4), the multi-layer circuit structure 40 comprises the top-layer circuit 41, the top dielectric layer 44, the inner-layer circuit 42, and the inner dielectric layer 43. The top-layer circuit 41, the top dielectric layer 44, the inner-layer circuit 42, the inner dielectric layer 43 are sequentially overlapping on the corrosion-blocking layer 30, and the top-layer circuit 41 is electrically connected to the inner-layer circuit 42.

Please refer to FIGS. 3D to 3H. The multi-layer circuit structure 40 is formed on the bottom-layer circuit structure 60. Specifically, in one embodiment, in the step of forming the bottom-layer circuit structure 60 on the multi-layer circuit structure 40 (step S5), firstly a laser is applied on the inner dielectric layer 43 to from a perforation 431 connected to the inner-layer circuit 42, so that the perforation 431 exposes the inner-layer circuit 42. Then, a first electroplating seed layer 600 is disposed on the inner dielectric layer 43, the wall of the perforation 431, and the inner-layer circuit 42. Next, a first patterned photoresist layer 50 is formed on the first electroplating seed layer 600. The first patterned photoresist layer 50 comprises a patterned area 51 and a covering area 52 connected to the patterned area 51. The position of the patterned area 51 of the first patterned photoresist layer 50 corresponds to the position of the perforation 431. The covering area 52 of the first patterned photoresist layer 50 covers the first electroplating seed layer 600. Therefore, the first patterned photoresist layer 50 exposes portions of the first electroplating seed layer 600 that are in the perforation 431. Next, the first electroplating seed layer 600 is electroplated in a copper sulfate (CuSO$_4$) solution having a concentration from 230 g/l to 250 g/l under a voltage from 5 volts to 6 volts for 65 minutes to obtain the second conduction pillar 62 and the bottom-layer circuit 64. Wherein, the bottom-layer circuit 61 is disposed on the inner dielectric layer 43 through the first electroplating seed layer 600 and located in the patterned area 61 of the first patterned photoresist layer 50, and the second conduction pillar 62 is located in the perforation 431 and connected between the bottom-layer circuit 61 and the inner-layer circuit 42, so that the bottom-layer circuit 61 is electrically connected to the inner-layer circuit 42.

Figure 3E:
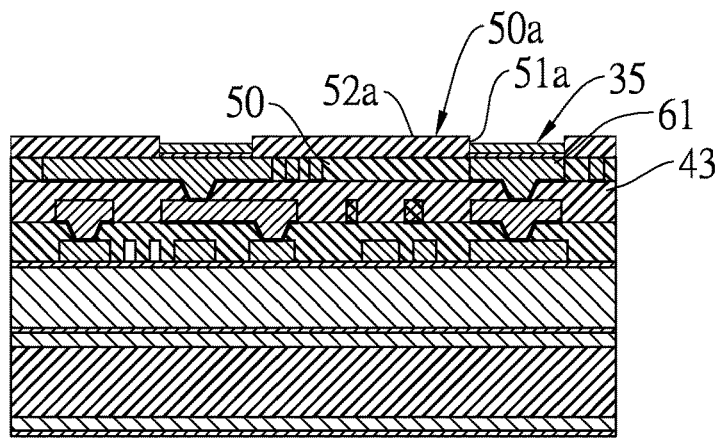

Next, please refer to FIG. 3E. A second patterned photoresist layer 50a is disposed on the bottom-layer circuit 61 and the first patterned photoresist layer 50. The second patterned photoresist layer 50a comprises a patterned area 51a and a covering area 52a connected to the patterned area 51a. The patterned area 51a of the second patterned photoresist layer 50a exposes the bottom-layer circuit 61. The covering area 52a of the second patterned photoresist layer 50a covers the bottom-layer circuit 51. Then, the conductive corrosion-barrier layer 35 is formed on the bottom-layer circuit 61. The conductive corrosion-barrier layer 35 is conductive, and the conductive corrosion-barrier layer 35 is located in the patterned area 51a of the second patterned photoresist layer 50a.

Figure 3F:
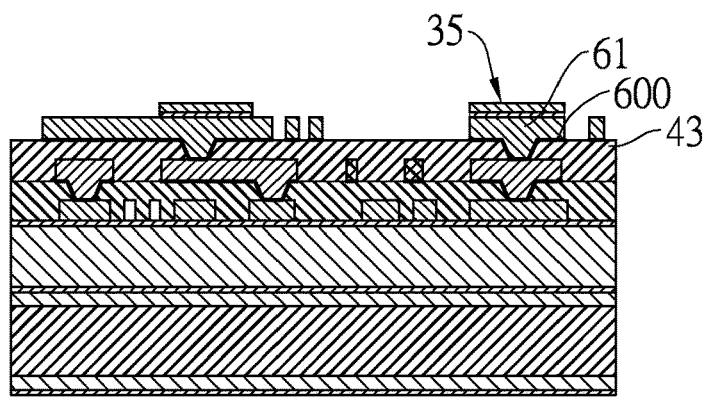

Next, please refer to FIG. 3F. A stripping liquid is applied to remove the first patterned photoresist layer 50 and the second patterned photoresist layer 50a, so that portions of the first electroplating seed layer 600 covered by the covering area 52 of the first patterned photoresist layer 50, the bottom-layer circuit 61, and the inner dielectric layer 43 are exposed. Next, a flash etching technique is applied to remove the exposed portions of the first electroplating seed layer 600 (i.e., portions of the first electroplating seed layer 600 uncovered by the bottom-layer circuit 61).

Figure 3G:
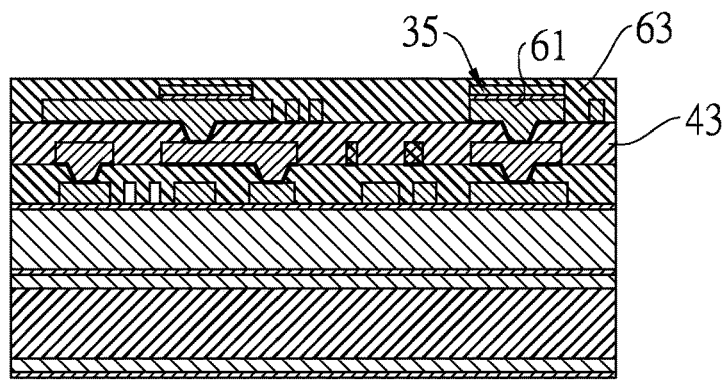
Figure 3H:
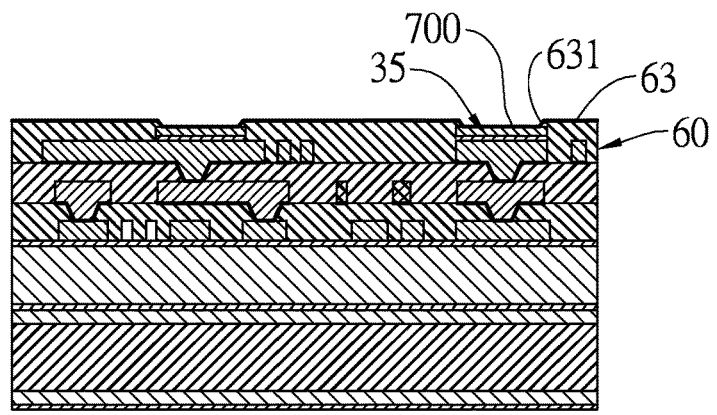
Figure 3I:
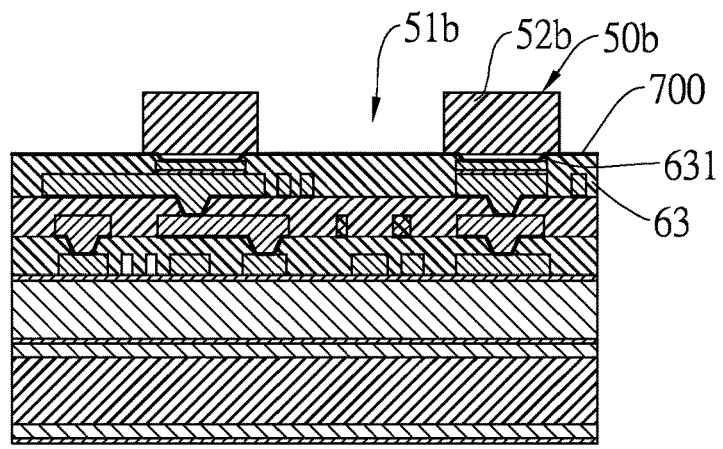

Next, please refer to FIG. 3G. A bottom dielectric layer 63 is covering the bottom-layer circuit 61, the conductive corrosion-barrier layer 35, and the inner dielectric layer 43. Then, please refer to FIG. 3H. A laser is applied on the bottom dielectric layer 63 to form an opening 631 connected to the conductive corrosion-barrier layer 35, so that the bottom dielectric layer 63 exposes the conductive corrosion-barrier layer 35, and the bottom-layer circuit structure 60 is on the multi-layer circuit structure 40.

Specifically, in one embodiment, in the step of forming the first patterned photoresist layer 50 on the first electroplating seed layer 600, firstly a first photoresist layer is overlapping on the first electroplating seed layer 600; then, the image of a first film is transferred to the first photoresist layer by exposure, so that an image-transferred first photoresist layer is obtained; next, the image-transferred first photoresist layer is developed, so that the first patterned photoresist layer 50 is obtained.

Specifically, in one embodiment, in the step of disposing a second patterned photoresist layer 50a on the bottom-layer circuit 61 and the first patterned photoresist layer 50, firstly a second photoresist layer is disposed on the bottom-layer circuit 61 and the first patterned photoresist layer 50; then, the image of a second film is transferred to the second photoresist layer by exposure, so that an image-transferred second photoresist layer is obtained; next, the image transferred second photoresist layer is developed, so that the second patterned photoresist layer 50a is obtained.

In one embodiment, in the step of forming the conductive corrosion-barrier layer 35 on the bottom-layer circuit 61, firstly the bottom-layer circuit 61 is electroless-plated in a nickel sulfate hexahydrate (NiSO$_4$.6H$_2$O) solution having a concentration from 260 g/l to 310 g/l for 14 minutes to obtain the nickel layer 352 on the bottom-layer circuit 61; then, the nickel layer 352 is electroplated in a gold solution having a concentration from 2.8 g/l to 6.0 g/l under a voltage from 0.1 volts to 5 volts to obtain the gold layer 351 on the nickel layer 352 and to obtain the conductive corrosion-barrier layer 35.

Please refer to FIGS. 3 H to 3J. In the step of forming a delivery loading plate 70 on the bottom-layer circuit structure 60, specifically, in one embodiment, a second electroplating seed layer 700 is disposed on the bottom dielectric layer 63, the conductive corrosion-barrier layer 35, and the wall of the opening 631; then, a third patterned photoresist layer 50b is formed on the second electroplating seed layer 700. The third patterned photoresist layer 50b comprises a patterned area 51b and a covering area 52b connected to the patterned area 51b. The position of the patterned area 51b of the third patterned photoresist layer 50b corresponds to the position of the opening 631. The patterned area 51b of the third patterned photoresist layer 50b exposes the second electroplating seed layer 700. Accordingly, the third patterned photoresist layer 50b exposes portions of the second electroplating seed layer 700 that are in the opening 631.

Figure 3J:
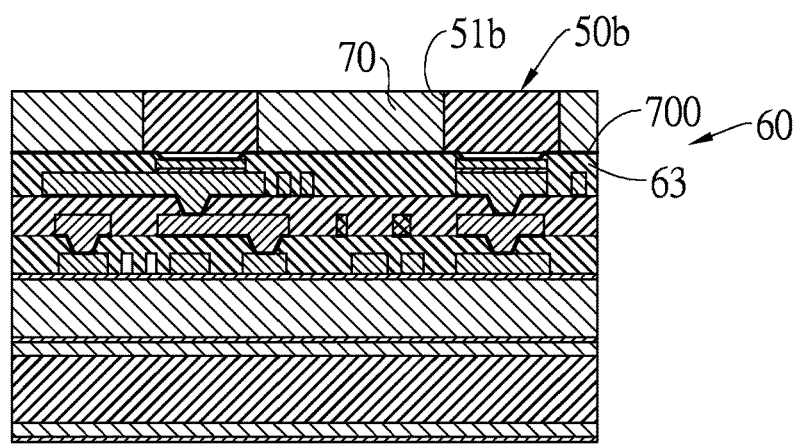

Next, please refer to FIG. 3J, the second electroplating seed layer 700 is electroplated in a copper sulfate ($CuSO_4$) solution having a concentration from 100 g/l to 120 g/l under a voltage from 5 volts to 6 volts for 169 minutes to obtain the delivery loading plate 70 located in the patterned area 51b of the third patterned photoresist layer 50b.

Specifically, in one embodiment, in the step of forming a third patterned photoresist layer 50b on the second electroplating seed layer, firstly a third photoresist layer is overlapping on the second electroplating seed layer 700; then, the image of a third film is transferred to the third photoresist layer by exposure, so that an image-transferred third photoresist layer is obtained; next, the image-transferred third photoresist layer is developed, so that the third patterned photoresist layer 50b is obtained.

Figure 3K:
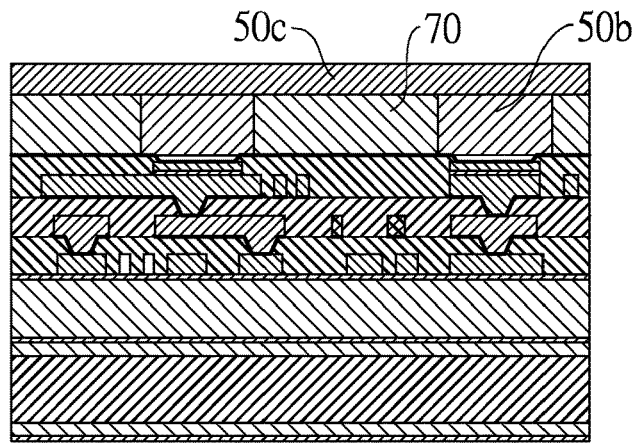
Figure 3L:
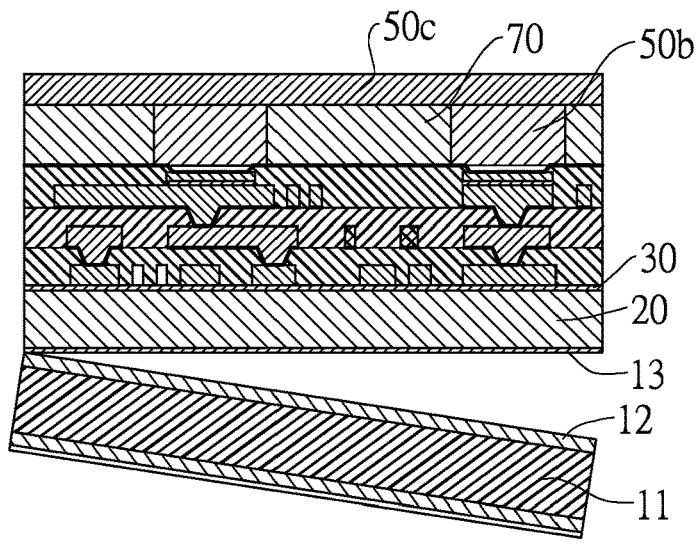
Figure 3M:
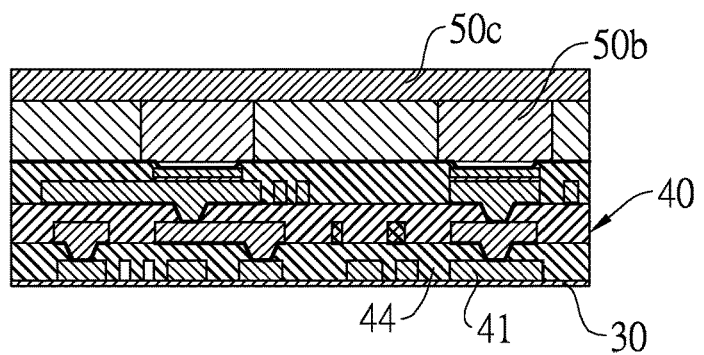
Figure 3N:
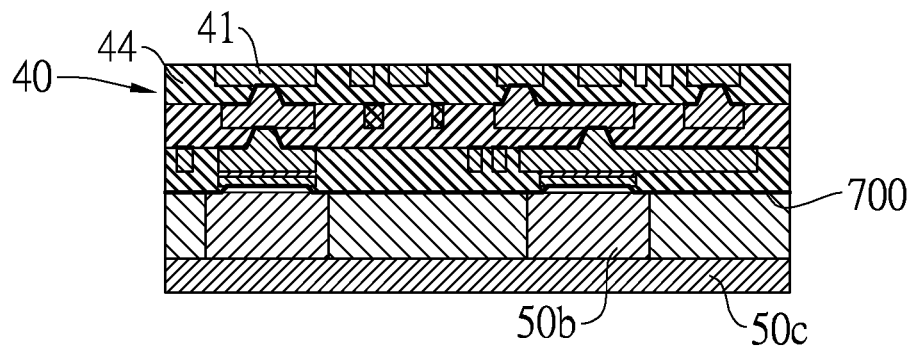

Please refer to FIGS. 3K and 3L. In the step of forming a fourth patterned photoresist layer 50c covering the delivery loading plate 70 and peeling off the substrate 1 and the conductive layer 12 of the first loading plate 10 (step S7), firstly a fourth photoresist layer is formed on the delivery loading plate 70 and the third patterned photoresist layer 50b; then, the fourth photoresist layer is exposed to obtain an exposed fourth photoresist layer; next, the exposed fourth photoresist layer is developed to obtain the fourth patterned photoresist layer 50c; and then, the conductive layer 12 is detached from the metal interface layer 13, so that the conductive layer 12 and the substrate 11 are peeled off.

Please refer to FIGS. 3L, 3M, 3N, 4A, and 4B. The second loading plate 20, the metal interface layer 13, the corrosion-blocking layer 30, and the fourth patterned photoresist layer 50c are removed to obtain the multi-layer circuit board. Specifically, in one embodiment, in the step of removing the second loading plate 20, the metal interface layer 13, the corrosion-blocking layer 30, and the fourth patterned photoresist layer 50c to obtain the multi-layer circuit board (step S8), firstly the second loading plate 20 and the metal interface layer 13 are chemical-etched by a solution having a $Cu^{2+}$ concentration from 135 g/l to 175 g/l so as to remove the second loading plate 20 and the metal interface layer 13; next, the corrosion-blocking layer 30 is removed to expose the top-layer circuit 41 and the top dielectric layer 44 of the multi-layer circuit structure 40 by a nickel-stripping manner; then, the third patterned photoresist layer 50b and the fourth patterned photoresist layer 50c are removed by a stripping liquid, so that portions of the second electroplating seed layer 700 originally covered by the covering area 51b of the third patterned photoresist layer 50b are exposed.

Figure 4A:
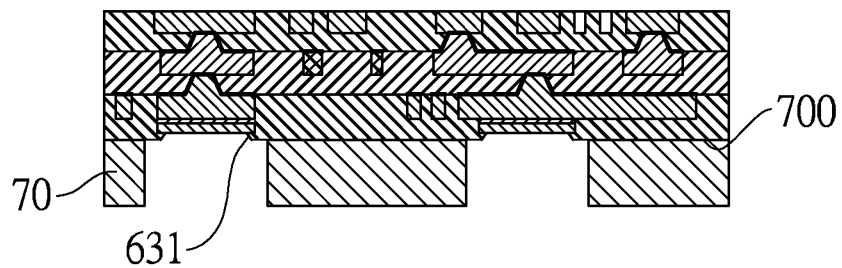
Figure 4B:
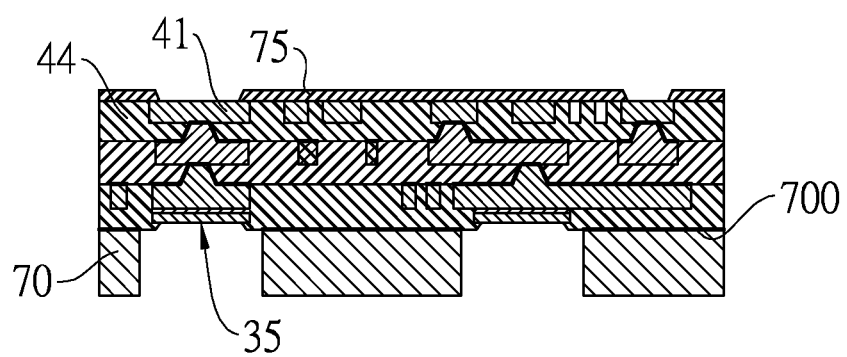

Then, please refer to FIGS. 4A and 4B. A flash etching technique is applied to remove the exposed portions of second electroplating seed layer 700 (i.e., portions of the second electroplating seed layer 700 uncovered by the delivery loading plate), so that the conductive corrosion-barrier layer 35 is exposed. Next, a solder mask layer 75 exposing the top-layer circuit 41 and covering the top dielectric layer 44 is formed on the multi-layer circuit structure 40, so that the multi-layer circuit board capable of being applied with electrical testing is obtained.

In one embodiment, the first patterned photoresist layer 50, the second patterned photoresist layer 50a, the third patterned photoresist layer 50b, and the fourth patterned photoresist layer 50c are made of dried photoresists.

The multi-layer circuit structure 40 is disposed on the delivery loading plate 70 through the bottom-layer circuit structure 60, the delivery loading plate 70 exposes the conductive corrosion-barrier layer 35, and the top-layer circuit 41 of the multi-layer circuit structure 40 is electrically connected to the conductive corrosion-barrier layer 35 through the inner-layer circuit 42 and the bottom-layer circuit 61. Therefore, before the multi-layer circuit board is delivered to the assembly company or before the multi-layer circuit board is packaged with chips, an electrical testing can be applied to the multi-layer circuit board to check the circuit between the top-layer circuit 41 and the conductive corrosion-barrier layer 35 is conductive or not. In other words, before the multi-layer circuit board is packaged with the chips, the multi-layer circuit board can be checked if it can be operated normally. Hence, not only the product quality of multi-layer circuit board can be checked, but also the cost for figuring out reasons of the unqualified electronic component can be reduced. Moreover, the responsibilities for the unqualified electrical testing result of the electronic component can be clarified efficiently.

Furthermore, since the delivery loading plate 70 is made of metal, the delivery loading plate 70 can provide a proper supporting force for the conductive corrosion-barrier layer 35, the bottom-layer circuit structure 60, the multi-layer circuit structure 40, and the solder mask layer 70. Hence, the bottom dielectric layer 63, the top dielectric layer 44, and the inner dielectric layer 43 may exclude glass fiber. For instance, the bottom dielectric layer 63, the top dielectric layer 44, and the inner dielectric layer 43 may be Ajinomoto build-up films. Owning to excluding from glass fiber, the Ajinomoto build-up films have thinner thicknesses as compared with plastic sheets having glass fiber (e.g., the plastic sheets made of bismaleimide triazine (BT) and glass fiber). Therefore, when the Ajinomoto build-up films are used for making the bottom dielectric layer 63, the top dielectric layer 44, or the inner dielectric layer 43, the overall thickness of the multi-layer circuit board can be reduced.

What is claimed is:

1. A multi-layer circuit board capable of being applied with electrical testing, the multi-layer circuit board comprising:
    a delivery loading plate made of metal and comprising a first side and a second side opposite to the first side;
    a bottom-layer circuit structure overlapping on the first side of the delivery loading plate and comprising:
    a bottom dielectric layer on the first side of the delivery loading plate; and
    a bottom-layer circuit on the bottom dielectric layer;
    a conductive corrosion-barrier layer on the bottom dielectric layer and electrically connected to the bottom-layer circuit; and
    a multi-layer circuit structure overlapping on the bottom-layer circuit structure and comprising:
    a top-layer circuit electrically connected to the bottom-layer circuit;

a top dielectric layer between the top-layer circuit and the bottom-layer circuit structure;

an inner dielectric layer on the bottom dielectric layer and the bottom-layer circuit; and an inner-layer circuit on the inner dielectric layer and connected to the top dielectric layer; wherein the top-layer circuit is on the top dielectric layer, and the delivery loading plate and the bottom dielectric layer expose the conductive corrosion-barrier layer;

wherein the delivery loading plate is not in contact with the conductive corrosion-barrier layer.

2. The multi-layer circuit board according to claim 1, wherein the bottom-layer circuit is embedded on the bottom dielectric layer, the top-layer circuit is embedded on the top dielectric layer, and the inner-layer circuit is embedded on the inner dielectric layer.

3. The multi-layer circuit board according to claim 2, wherein the multi-layer circuit structure further comprises a first conduction pillar, the first conduction pillar upwardly inserts on the top dielectric layer and the first conduction pillar is connected between the top-layer circuit and the inner-layer circuit, the bottom-layer circuit structure comprises a second conduction pillar, the second conduction pillar upwardly inserts on the inner dielectric layer and the second conduction pillar is connected between the inner-layer circuit and the bottom-layer circuit, the top-layer circuit is electrically connected to the bottom-layer circuit through the first conduction pillar, the inner-layer circuit, and the second conduction pillar.

4. The multi-layer circuit board according to claim 1, wherein the conductive corrosion-barrier layer is embedded on the bottom dielectric layer.

5. The multi-layer circuit board according to claim 2, wherein the conductive corrosion-barrier layer is embedded on the bottom dielectric layer.

6. A multi-layer circuit board capable of being applied with electrical testing, the multi-layer circuit board comprising:

a delivery loading plate made of metal and comprising a first side and a second side opposite to the first side;

a bottom-layer circuit structure overlapping on the first side of the delivery loading plate and comprising:

a bottom dielectric layer on the first side of the delivery loading plate; and a bottom-layer circuit on the bottom dielectric layer;

a conductive corrosion-barrier layer on the bottom dielectric layer and electrically connected to the bottom-layer circuit; and a multi-layer circuit structure overlapping on the bottom-layer circuit structure and comprising:

a top-layer circuit electrically connected to the bottom-layer circuit;

a top dielectric layer between the top-layer circuit and the bottom-layer circuit structure;

an inner dielectric layer on the bottom dielectric layer and the bottom-layer circuit; and an inner-layer circuit on the inner dielectric layer and connected to the top dielectric layer; wherein the top-layer circuit is on the top dielectric layer, and the delivery loading plate and the bottom dielectric layer expose the conductive corrosion-barrier layer;

wherein the bottom-layer circuit is embedded on the bottom dielectric layer, the top-layer circuit is embedded on the top dielectric layer, and the inner-layer circuit is embedded on the inner dielectric layer;

wherein the multi-layer circuit structure further comprises a first conduction pillar, the first conduction pillar upwardly inserts on the top dielectric layer and the first conduction pillar is connected between the top-layer circuit and the inner-layer circuit, the bottom-layer circuit structure comprises a second conduction pillar, the second conduction pillar upwardly inserts on the inner dielectric layer and the second conduction pillar is connected between the inner-layer circuit and the bottom-layer circuit, the top-layer circuit is electrically connected to the bottom-layer circuit through the first conduction pillar, the inner-layer circuit, and the second conduction pillar;

wherein the conductive corrosion-barrier layer is embedded on the bottom dielectric layer.

7. The multi-layer circuit board according to claim 1, wherein the conductive corrosion-barrier layer comprises at least one of gold, nickel, tin, iron, and titanium.

8. The multi-layer circuit board according to claim 6, wherein the conductive corrosion-barrier layer comprises a gold layer and a nickel layer, the nickel layer is connected between the gold layer and the bottom-layer circuit.

9. The multi-layer circuit board according to claim 3, wherein the conductive corrosion-barrier layer comprises at least one of gold, nickel, tin, iron, and titanium.

10. The multi-layer circuit board according to claim 7, wherein the conductive corrosion-barrier layer comprises a gold layer and a nickel layer, the nickel layer is connected between the gold layer and the bottom-layer circuit.

11. The multi-layer circuit board according to claim 6, further comprising a solder mask layer, wherein the solder mask layer exposes the top-layer circuit to cover the top dielectric layer.

12. The multi-layer circuit board according to claim 9, wherein the conductive corrosion-barrier layer comprises a gold layer and a nickel layer, the nickel layer is connected between the gold layer and the bottom-layer circuit.

13. The multi-layer circuit board according to claim 1, further comprising a solder mask layer, wherein the solder mask layer exposes the top-layer circuit to cover the top dielectric layer.

14. A multi-layer circuit board capable of being applied with electrical testing, the multi-layer circuit board comprising:

a delivery loading plate made of metal and comprising a first side and a second side opposite to the first side;

a bottom-layer circuit structure overlapping on the first side of the delivery loading plate and comprising:

a bottom dielectric layer on the first side of the delivery loading plate; and a bottom-layer circuit on the bottom dielectric layer;

a conductive corrosion-barrier layer on the bottom dielectric layer and electrically connected to the bottom-layer circuit; and a multi-layer circuit structure overlapping on the bottom-layer circuit structure and comprising:

a top-layer circuit electrically connected to the bottom-layer circuit;

a top dielectric layer between the top-layer circuit and the bottom-layer circuit structure;

an inner dielectric layer on the bottom dielectric layer and the bottom-layer circuit; and an inner-layer circuit on the inner dielectric layer and connected to the top dielectric layer; wherein the top-layer circuit is on the top dielectric layer, and the delivery loading plate and the bottom dielectric layer expose the conductive corrosion-barrier layer;

wherein the bottom-layer circuit is embedded on the bottom dielectric layer, the top-layer circuit is embedded on the top dielectric layer, and the inner-layer circuit is embedded on the inner dielectric layer;
wherein the multi-layer circuit structure further comprises a first conduction pillar, the first conduction pillar upwardly inserts on the top dielectric layer and the first conduction pillar is connected between the top-layer circuit and the inner-layer circuit, the bottom-layer circuit structure comprises a second conduction pillar, the second conduction pillar upwardly inserts on the inner dielectric layer and the second conduction pillar is connected between the inner-layer circuit and the bottom-layer circuit, the top-layer circuit is electrically connected to the bottom-layer circuit through the first conduction pillar, the inner-layer circuit, and the second conduction pillar;
wherein a bottom portion of at least one portion of the inner-layer circuit is connected to a top portion of the bottom-layer circuit via the first conduction pillar, and a top portion of the at least one portion of the inner-layer circuit is connected to a bottom portion of the top-layer circuit via the second conduction pillar.

15. The multi-layer circuit board according to claim 3, further comprising a solder mask layer, wherein the solder mask layer exposes the top-layer circuit to cover the top dielectric layer.

16. The multi-layer circuit board according to claim 14, wherein the conductive corrosion-barrier layer is embedded on the bottom dielectric layer.

17. The multi-layer circuit board according to claim 14, wherein the conductive corrosion-barrier layer comprises at least one of gold, nickel, tin, iron, and titanium.

18. The multi-layer circuit board according to claim 17, wherein the conductive corrosion-barrier layer comprises a gold layer and a nickel layer, the nickel layer is connected between the gold layer and the bottom-layer circuit.

19. The multi-layer circuit board according to claim 14, further comprising a solder mask layer, wherein the solder mask layer exposes the top-layer circuit to cover the top dielectric layer.

20. The multi-layer circuit board according to claim 6, wherein the conductive corrosion-barrier layer comprises at least one of gold, nickel, tin, iron, and titanium.

* * * * *